United States Patent [19]
Wilhelm et al.

[11] Patent Number: 4,790,438
[45] Date of Patent: Dec. 13, 1988

[54] ELECTRICAL COMPONENT SEQUENTIAL TESTING APPARATUS

[75] Inventors: William G. Wilhelm; Joseph W. Crownover, both of La Jolla, Calif.

[73] Assignee: Array Instruments, Inc., San Diego, Calif.

[21] Appl. No.: 33,722

[22] Filed: Apr. 3, 1987

Related U.S. Application Data

[63] Continuation-in-part of Ser. No. 18,028, Feb. 24, 1987, abandoned.

[51] Int. Cl.$^4$ .................. B07C 5/344; G01R 15/00
[52] U.S. Cl. .................. 209/573; 209/574; 209/919; 324/73 AT; 324/158 F
[58] Field of Search ................ 209/571–575, 209/919, 934; 324/158 F, 73 AT, 73 R, 158 D; 198/392, 397; 221/167, 182, 265

[56] References Cited

U.S. PATENT DOCUMENTS

| | | | |
|---|---|---|---|
| 2,855,113 | 10/1958 | Roske | 221/182 X |
| 4,179,032 | 12/1979 | Artz et al. | 209/575 X |
| 4,500,003 | 2/1985 | Cedrone | 324/158 F X |

FOREIGN PATENT DOCUMENTS

| | | | |
|---|---|---|---|
| 0299045 | 5/1971 | U.S.S.R. | 324/158 F |
| 0565330 | 8/1977 | U.S.S.R. | 324/73 AT |
| 0680210 | 8/1979 | U.S.S.R. | 324/158 F |

Primary Examiner—Robert B. Reeves
Assistant Examiner—Edward M. Wacyra
Attorney, Agent, or Firm—William W. Haefliger

[57] ABSTRACT

Sorting apparatus for electrical components includes:
(a) an electrical test station,
(b) a transport forming pockets for receiving electrical components and for sequentially lifting the received components to the test station,
(c) test circuitry including relatively movable contacts, at the test station, for electrically testing the components in the pockets, sequentially,
(d) and the tested components then being discharged form the pockets in accordance with their testing.

A novel rotary transport is also provided, with an annular, frusto-conical guide slot for a swingable contact, to successively engage the components.

10 Claims, 4 Drawing Sheets

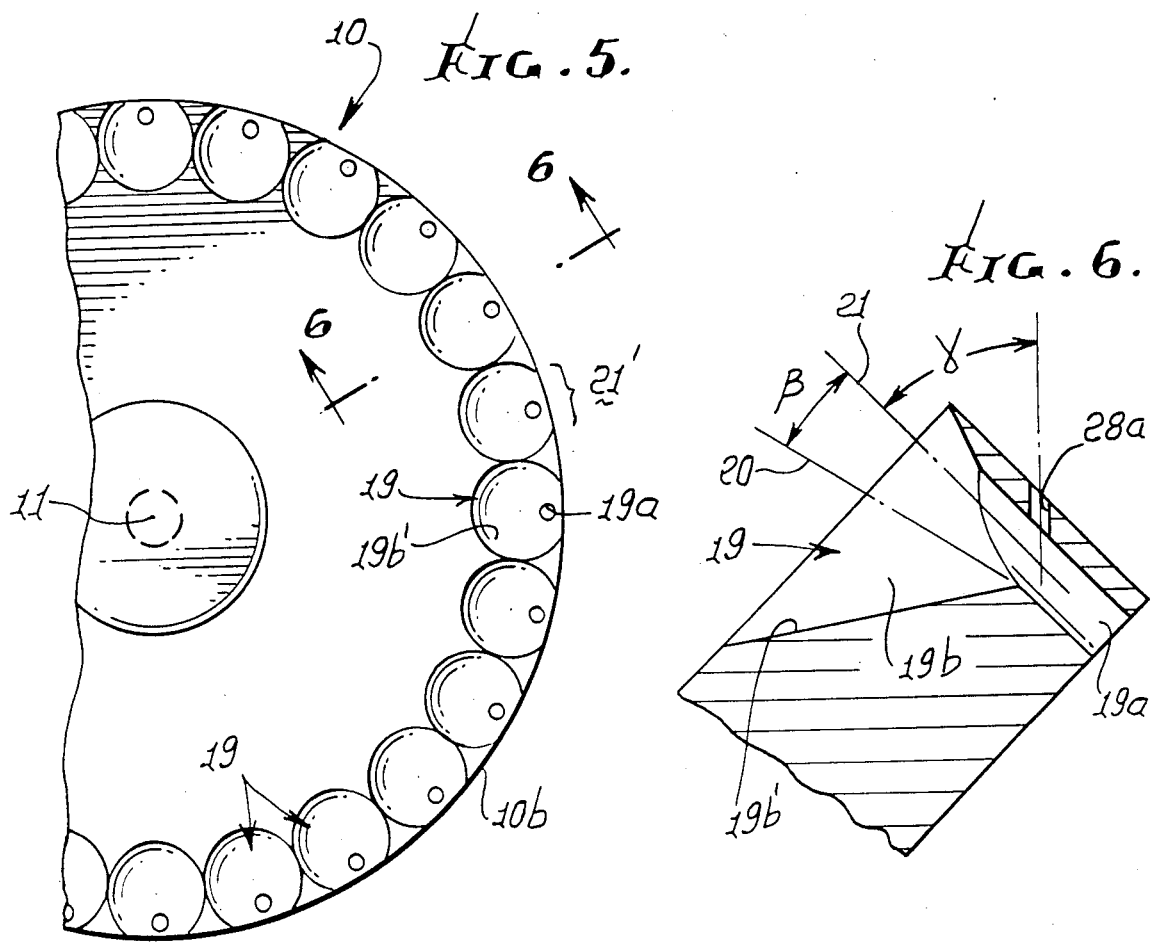
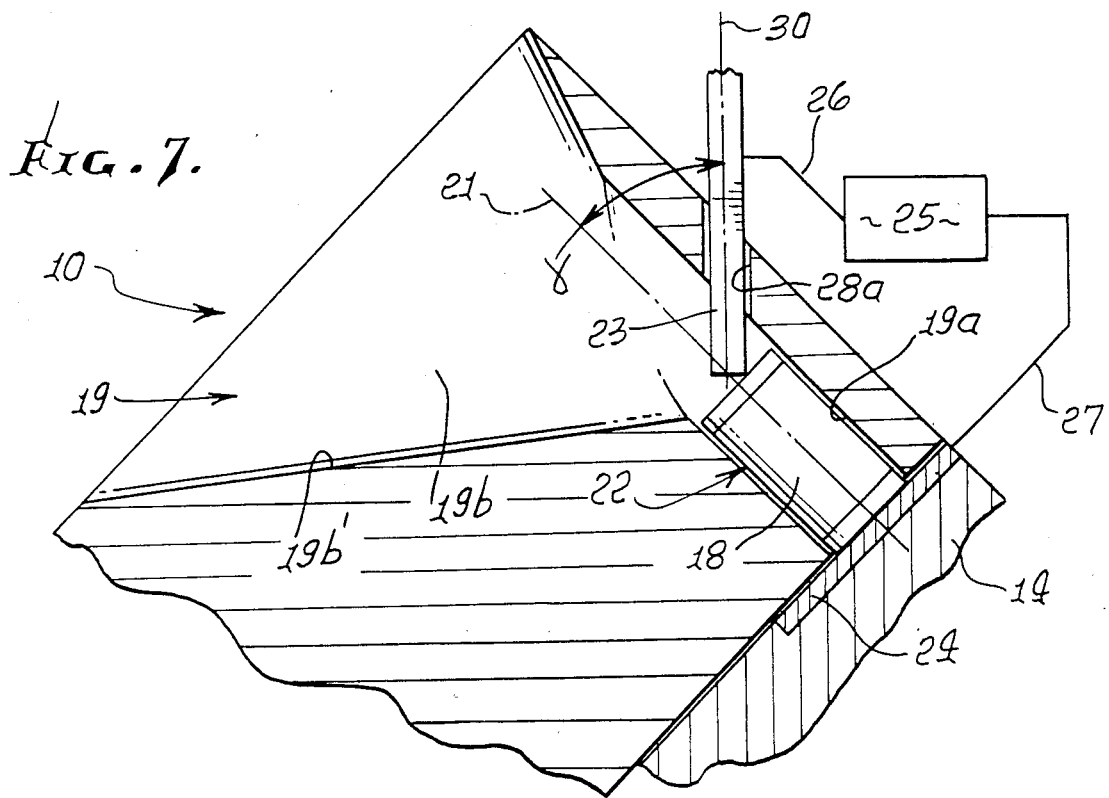

ELECTRICAL COMPONENT SEQUENTIAL TESTING APPARATUS

BACKGROUND OF THE INVENTION

This application is a continuation-in-part of Ser. No. 018,028, filed Feb. 24, 1987, now abandoned.

This invention relates generally to apparatus for testing electrical components, and more particularly to apparatus for rapidly elevating electrical components, sequentially, from a supply of such components in a receptacle or bowl for testing at an upper elevation.

Various electrical components such as capacitors, diodes and resistors are often made in the form of very small chips. Before the chips are utilized they must be subjected to various electrical tests and then sorted in accordance with the results of the tests. In a typical case, a component is tested to assure that it meets appropriate specifications, and the sorting process then involves separating the acceptable components or chips from the rejects.

One prior art component handler picks up a given component by vacuum, moves the component to a test jig where a tester electrically tests the component and then moves the component to an appropriate bin. The time required with the vacuum system to move a component from the pick-up stage to the test jig requires approximately three times the time needed to electrically test that component. Thus, the overall sorting rates were limited by operation of the handler. Low sorting rates can add significantly to production costs.

Another prior device includes a delivery system consisting of a rotating disk nested in a bowl some inches in depth. The disk utilizes many evenly spaced holes located near the outer perimeter of the disk, and as the disk rotates, components fall into the various holes and are carried separately to a test station.

However, the construction of the holes greatly inhibits good contacting of the components by conventional contacting systems In general, a contact would have to be lifted above the walls of the holes before the next hole carrying a new component could be moved into the test position. A complex pogo-stick type contact system works in this manner. However, in bringing the contact back down into contact with the next component, a hammering action takes place which could cause damage to fragile components and the pogo contact.

A further prior art system comprises a narrow metallic contact that traverses a narrow groove that intersects all holes in a disk parallel to the axis of each hole and diametrically. Generally, contact is made with two terminals of a given component as that component is moved into the test position. The system is subject to clogging and the dropping of "out-of-tolerance" components into otherwise good component bins. A further disadvantage of this latter system rests with the fact that the contact jumps out of its guidance groove as a result of more than one component lying in the hole system as that hole is moved into the test position.

SUMMARY OF THE INVENTION

It is a major object of the invention to provide improved apparatus overcoming the above described disadvantages and problems with prior electrical component test apparatus Basically, the apparatus of the invention comprises:

(a) an electrical test station,
(b) transport means forming pockets for receiving electrical components and for sequentially lifting said received components to the test station,
(c) test means including relatively movable contacts at the test station for electrically testing the components in the pockets, sequentially,
(d) and the tested components then being discharged from the pockets in accordance with their testing.

As will appear, a receptacle or bowl is typically provided in which multiple of said electrical components are received for exposure to said pockets so as to loosely fit therein, the transport means extending into the receptacle at an angle such that electrical components lifted by the transport means, but not received in the pockets, fall back into the receptacle. That transport means may comprise a rotor or disc forming the pockets with tapered or chamfered upper entrances, and arranged in an annular sequence; and the rotor may have an axis of rotation between 30° and 60° from horizontal so that components lifted from the receptacle but not in the pockets tend to fall back into the receptacle.

Further, the electrical contacts are engageable with opposite ends of an electrical component in the pocket lifted to the test station; one contact typically comprises a conductive ring extending beneath the pockets to engage lower ends of the components received in the pockets; and the other of the contacts comprises a runner at the test station sidewardly movable into position over the upper end of the component in the pocket lifted to the test station. Also, the rotor typically and advantageously defines a guide groove within which the runner is movable back and forth sidewardly relative to the upper ends of components at the test station, and into and out of engagement with said upper ends of the components. That groove or slot is typically frustoconical and annular, to intersect all pockets.

In addition, the pockets typically have cylindrical lower portions, and upper portions defining flaring recesses sidewardly intersecting said cylindrical lower portions, the flaring recess intersecting the periphery of the later.

These and other object and advantages of the invention, as well as the details of an illustrative embodiment, will be more fully understood from the following specification and drawings, in which:

DRAWING DESCRIPTION

FIG. 5 is a plan view of an index wheel or rotor;

FIG. 6 is an enlarged fragmentary section taken through a pocket in an index rotor, as on lines 6—6 of FIG. 5;

FIG. 7 is a schematic view showing component testing;

DETAILED DESCRIPION

Figure 1:
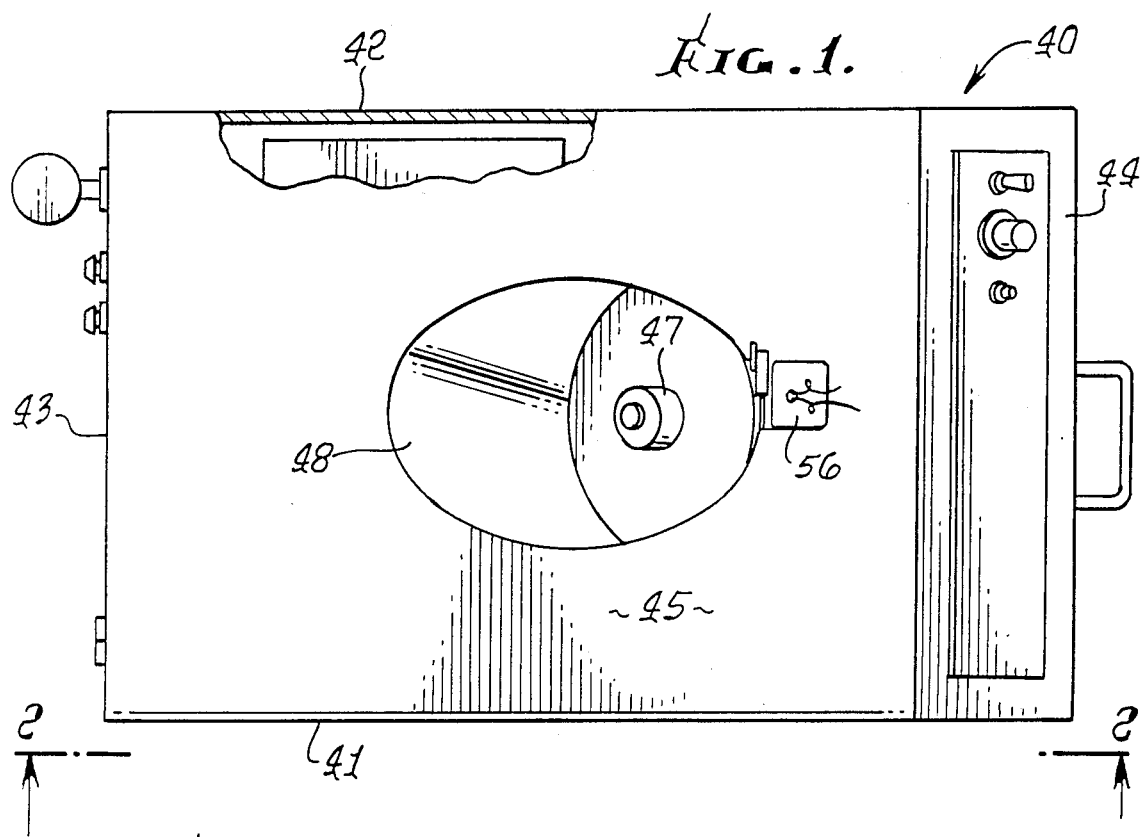
FIG. 1 is a top plan view of portable apparatus incorporating the invention.

Referring first to the schematic views FIGS. 7 and a transport means such as a disc or rotor 10 is rotatable about an axis 11 extending at an angle α relative to horizontal. Angle α is between 30° and 60°, and is preferably at about 45°. A drive to rotate the disc includes a motor 12 and shaft 13 connected to the disc at 13a. The bottom 10a of the disc rotates adjacent top surface 14a of a base 14. An annular wall 16 extends above the base and closely surrounds the disc, whereby a bowl or receptacle is formed, with a bowl interior 17. Electrical components to be sorted are indicated at 18, and they form an aggregation at the lower portion of the interior 17, as shown The disc forms a number of pockets or holes 19 that extend in annular series near the periphery 10b of the disc. See FIG. 5. The pockets have reduced diameter, cylindrical lower portions 19a spaced radially inwardly from the disc periphery, as well as upper portions that define flaring recesses or chamfers 19b that radially intersect the cylindrical lower portions. See FIGS. 6 and 7. The flaring recesses have generally conical walls 19b', defining conical axes 20 offset at angles β from the axes 21 of the hole lower portions 19a, angles β extending toward the disc axis 11. Walls 19b' also intersect the periphery of the disc, along arcs 21' (see FIG. 5), above the levels of the hole lower portions 19a.

The pockets are so shaped as to receive electrical components for sequential lifting of same, by the rotating disc, and toward a test station 22. FIG. 7 shows an individual electrical component 18, which is generally cylindrical, received closely into the pocket or hole lower portion 19a, and carried upwardly to the test station where an upper contact 23 engages the top of the component. The bottom of the component engages an annular base contact 24, and a test circuit 25 is connected by leads 26 and 27 to contacts 23 and 24, for testing the component. Note that the contact 23 is in the form of a "runner" or slider, which is movable endwise and generally vertically in a groove 28a formed in and through rotor wall 61. Such groove is formed in association with the pockets, so that the runner contact 23 may be extended successively through the groove when in registration with the contact, at the test station, to engage the tops of the components to be tested. This geometry and functioning is facilitated by the angularity of recesses or chamfers 19b to sidewardly intersect the inner sides of the hole lower portions, as shown. The lower ends of the electrical components slidably engage the base contact 24, carried by the base 14. Note angle γ between the pocket axis 21 and the axis 30 of runner endwise movement is 45°, typically.

Figure 8:
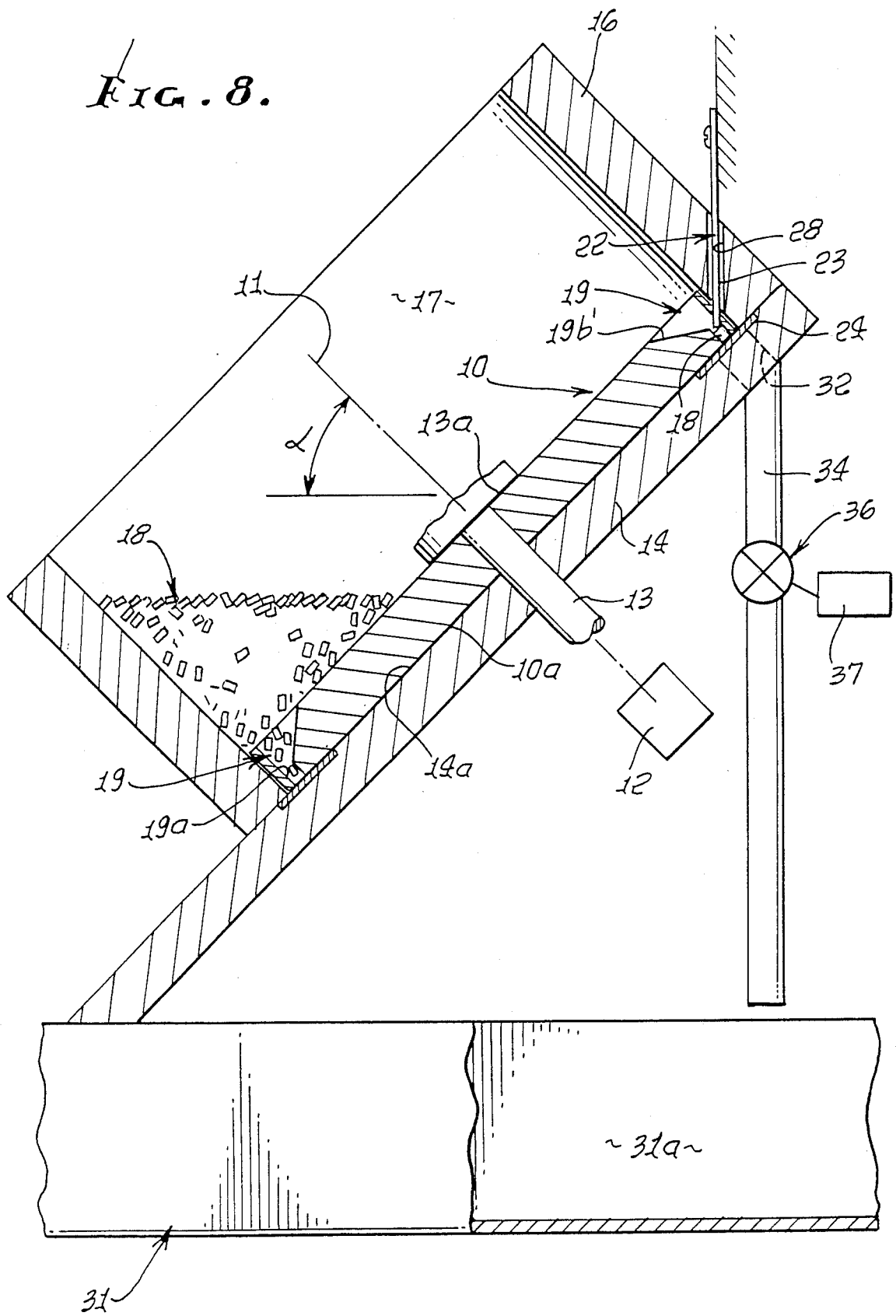
FIG. 8 is a schematic view of the apparatus, in operation.

FIG. 8 shows a mass of the electrical components 18 above the pockets, and entering the pockets, only one component being able to fully enter each pocket lower portion 19a to dwell therein during lifting, as seen in FIG. 7. Rotation of the disc tumbles the mass of components in such manner as to facilitate their entry, one at a time, into the successive pocket lower portions 19a moved under the mass.

Figure 2:
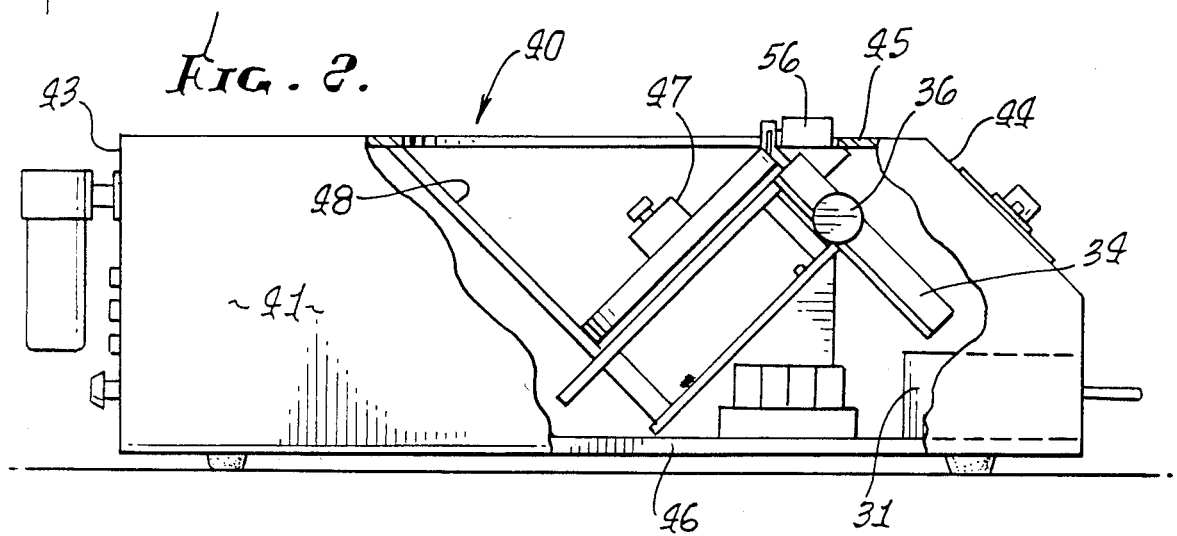
FIG. 2 is a side elevation on lines 2—2 of FIG. 1, and partly broken away to show interior construction.

Tested components are discharged downwardly from the pocket into bins indicated at 31 in FIG. 8. Suitable through opening 32 in the base comes into registration with holes 19a as the disc rotates, to receive the tested components by gravitation, for downward discharge via a chute 34. Thus, if a component tests acceptably, it discharges via opening 32 and a chute 34 for distribution 36 (see FIG. 2). And if a component does not test acceptably, it discharges via chute 34 to distributor 36 for discharge to reject bin, like bin 31. Control for the distributor valve appears at 37, in FIG. 8.

Figure 3:
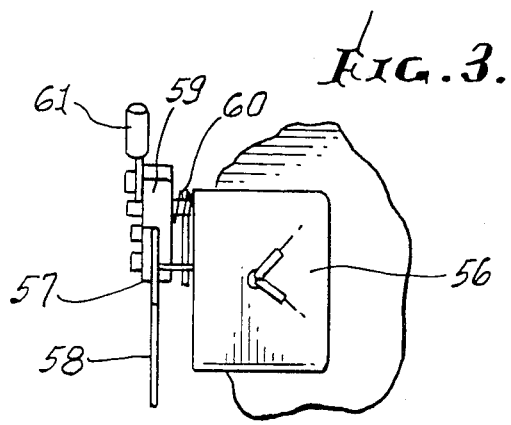
FIG. 3 is a top plan showing a contact block assembly, as used in FIGS. 1 and 2.
Figure 4:
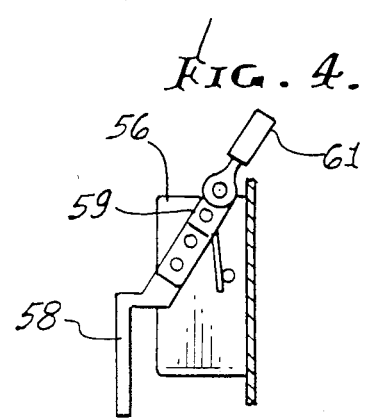
FIG. 4 is a side plan view of the FIG. 3 assembly.

Referring to FIGS. 1-4, the equipment as described is contained within a portable housing 40 having walls 41-46. A knob 47 in a recess 48 formed in the top wall providing controls for disc 10, manually, if desired. The test station 22, is also indicated in FIGS. 3 and 4 as including a contact block 56, cam 57, contact blade 58, block movement 59, torsion spring 60, and lug 61. The runner 23 is moved endwise in response to operation of elements 56-61, and in synchronism with disc rotation.

Figure 9:
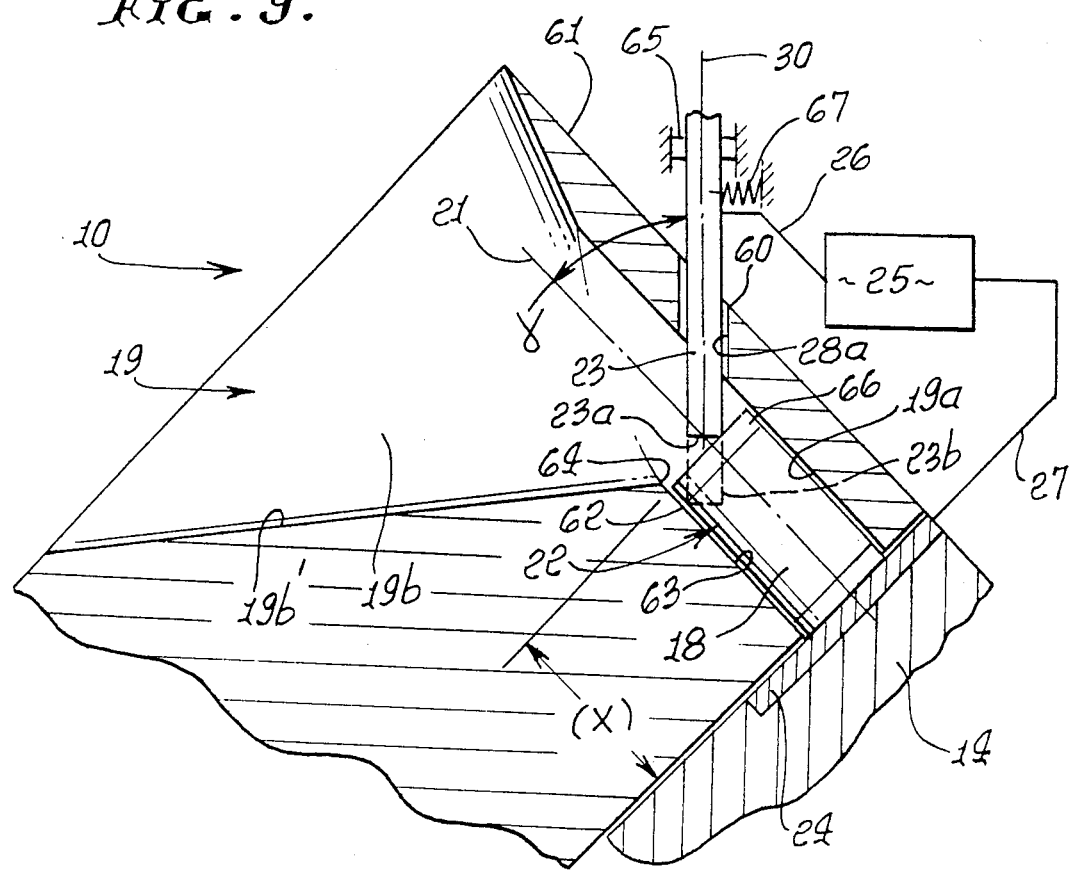
FIG. 9 is a view like FIG. 7.

In FIG. 9, which is similar to FIG. 7, corresponding elements bear the same numbers. It will further be noted that slot or slit 28a extends annularly about the axis of the rotor, and is frusto-conical about that axis. Also it extends from an annular intersection at 60 with the outer rim 61 of the rotor, to the annular locus 62 adjacent inner wall 63 of the cylindrical portion 19a of the pocket that receives the electrical component to be tested. Locus 62 is near or adjacent the reduced diameter inner necks 64 of the tapered entrances 19. The contact or runner 23 is pivoted as at 65 to swing in the slot, i.e. loosely therein. Therefore, as the terminal end 66 of an electrical component 18 approaches the inner end 23a of runner 23, the latter is sidewardly cammed by the element 22 to pivot in the slot, and to engage the terminal end 66, as shown. The runner may be spring-urged as at 67 toward a down position in the slot i.e. forward broken line position 23b.

We claim:

1. In sorting apparatus for electrical components, the combination comprising:
   (a) an electrical test station,
   (b) transport means forming pockets for receiving electrical components and for sequentially lifting said received components to the test station,
   (c) test means including relatively movable contacts at the test station for electrically testing the components, sequentially,
   (d) and the tested components then being discharged from the pockets,
   (e) a receptacle in which multiple of said electrical components are received for exposure to said pockets so as to loosely fit therein, the transport means extending into the receptacle at an angle such as that electrical components lifted by the transport means, but not received in the pockets, fall back into the receptacle, the transport means comprising a rotor having said pockets with tapered entrances and in an annular sequence,
   (f) the electrical contacts being engageable with opposite ends of an electrical component in the pocket lifted to the test station, one contact comprising a conductive ring extending beneath said pockets, the other of the contacts comprising a runner at the test station sidewardly movable into position over the upper end of the component in the pocket lifted to the test station,
   (g) the rotor including a slot, extending about an axis about which the rotor is rotatable, and in which said runner is sidewardly movable, and
   (h) including a pivot supporting the runner for pivoting in said slot.

2. The combination of claim 1 wherein the rotor has an axis of rotation extending between 30° and 60° from horizontal.

3. The combination of claim 1 wherein said pockets have cylindrical lower portions, and said tapered entrances defining flaring recesses sidewardly intersecting said cylindrical lower portions.

4. The combination of claim 3 wherein said flaring recesses intersect the periphery of the rotor.

5. The combination of claim wherein said slot extends generally conically, about said axis.

6. The combination of claim 5 wherein said slot intersects said pockets below said tapered entrances.

7. The combination of claim 6 wherein said pockets have reduced diameter cylindrical portions intersecting necks defined by said tapered entrances, the annular slot intersecting said cylindrical portions, near said necks.

8. For use in sorting apparatus for electrical components, the sub-combination comprising:
 (a) a rotor comprising a rotor plate having upper and lower sides, and defining an axis of rotation, the rotor also defining an outer rim,
 (b) the rotor forming multiple pockets spaced about said axis and located proximate said rim, said pockets having a tapered entrances intersecting said upper side, and reduced diameter cylindrical portions intersecting said lower side and also intersecting reduced diameter necks defined by said tapered entrances, said necks located between said upper and lower sides,
 (c) and an annular slot formed in the rotor rim and extending at an angle relative to said axis so as to be frusto-conical about said axis, the slot intersecting said pockets and adapted to receive a runner contact relatively movable in the slot into and out of registration with said cylindrical portions as the rotor rotates about said axis, so as to be successively engageable with electrical components received in said cylindrical portions of the pockets.

9. The combination of claim 8 wherein said slot insects said pockets below said tapered entrances.

10. The combination of claim 9 wherein said slot intersects said cylindrical portions near said necks.

* * * * *